United States Patent

Toda et al.

[11] Patent Number: 6,061,279
[45] Date of Patent: May 9, 2000

[54] DELAY CIRCUIT FOR ANALOG SIGNALS

[75] Inventors: Akihiro Toda; Masao Noro; Toshio Maejima, all of Hamamatsu, Japan

[73] Assignee: Yamaha Corporation, Shizuoka-ken, Japan

[21] Appl. No.: 09/263,938

[22] Filed: Mar. 8, 1999

[30] Foreign Application Priority Data

Mar. 11, 1998 [JP] Japan .................................. 10-059727

[51] Int. Cl.$^7$ ..................................................... G11C 7/00
[52] U.S. Cl. ............................ 365/194; 365/45; 365/149; 365/239
[58] Field of Search ............................. 365/194, 45, 149, 365/239

[56] References Cited

U.S. PATENT DOCUMENTS

| | | | |
|---|---|---|---|
| 5,717,624 | 2/1998 | Kusumoto et al. | 365/45 |
| 5,793,698 | 8/1998 | Komarek et al. | 365/194 X |
| 5,798,960 | 8/1998 | Hughes | 365/45 |

FOREIGN PATENT DOCUMENTS

| | | |
|---|---|---|
| 52-87341 | 7/1977 | Japan . |
| 56-129419 | 10/1981 | Japan . |
| 3-201617 | 9/1991 | Japan . |

Primary Examiner—Huan Hoang
Attorney, Agent, or Firm—Reed Smith Hazel & Thomas LLP

[57] ABSTRACT

A delay circuit is provided, which is capable of eliminating the influence of noise of low frequency as disturbance. A plurality of memory cells including a plurality of capacitors store an analog signal as an input signal by storing charge of the input signal in the capacitors. A first inverting device inverts the input signal to generate an inverted signal. A control circuit generates and delivers control signals to the memory cells to select the input signal and the inverted signal alternately and sequentially write the selected signals into the memory cells in a predetermined writing sequence. The control circuit further generates and delivers to the memory cells to sequentially read out the input signal and the inverted signal from the memory cells in a sequence corresponding to the predetermined writing sequence. A second inverting device inverts the read-out inverted signal. An output signal is synthesized from the read-out input signal and an output signal of the second inverting device.

14 Claims, 13 Drawing Sheets

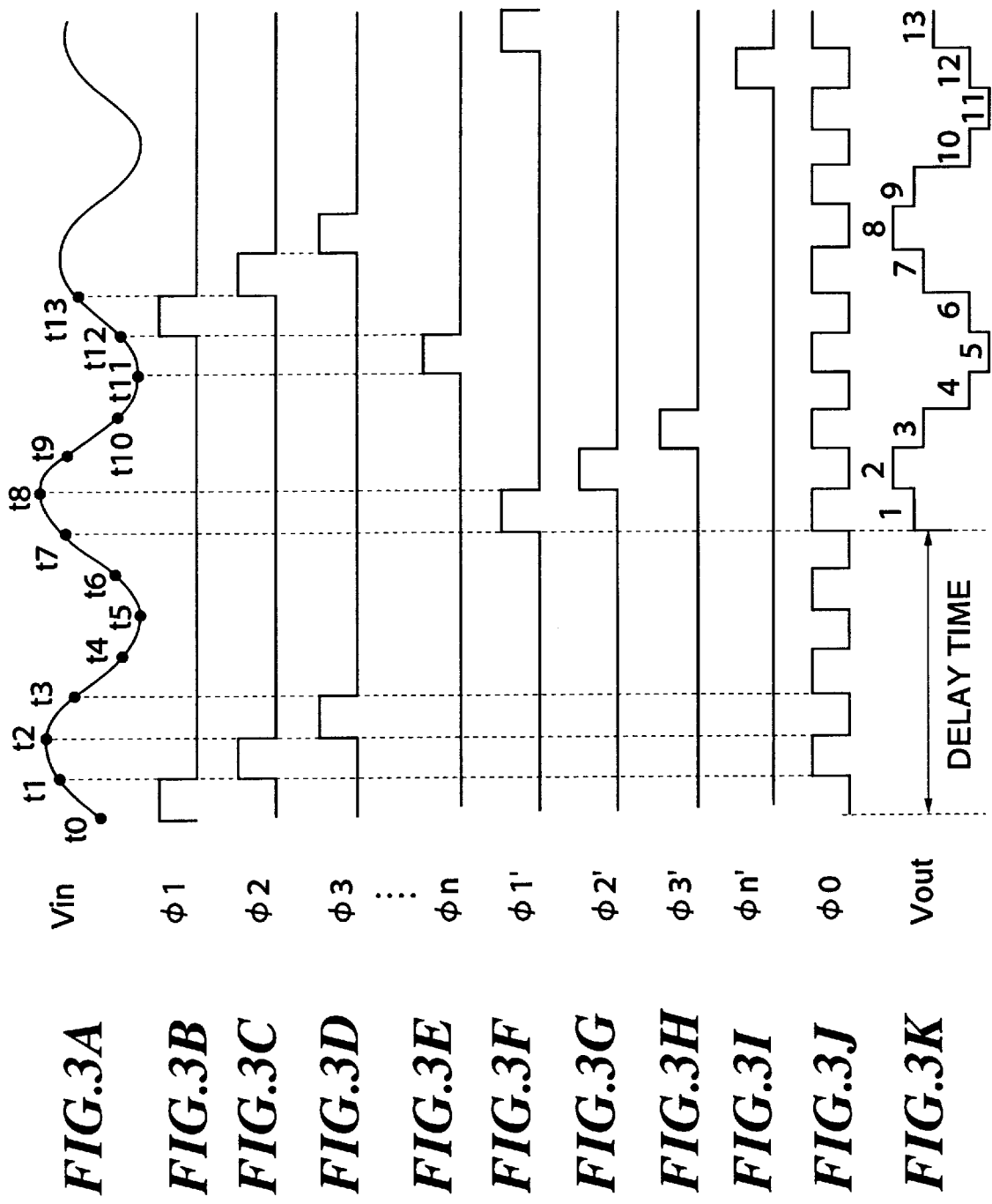

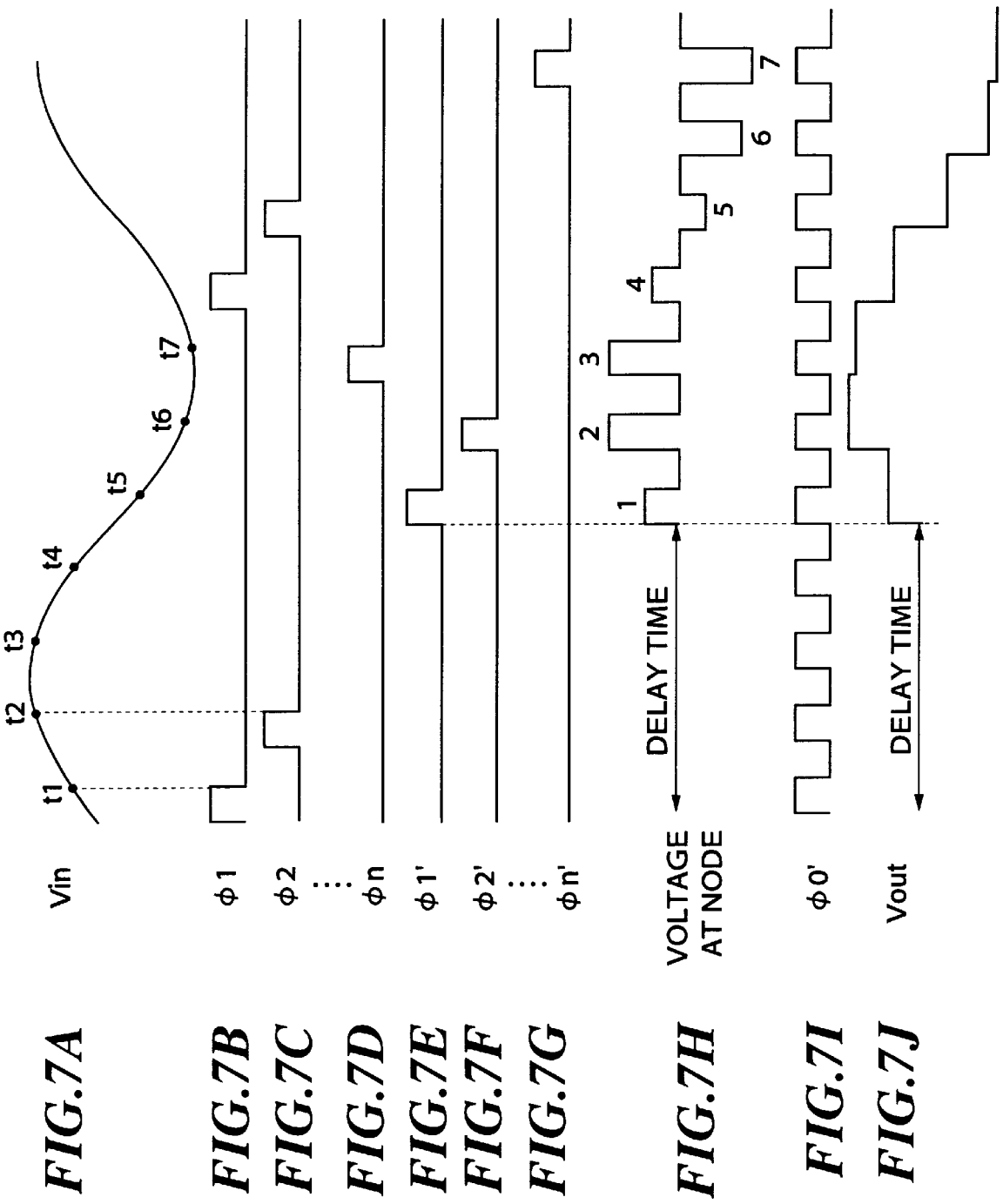

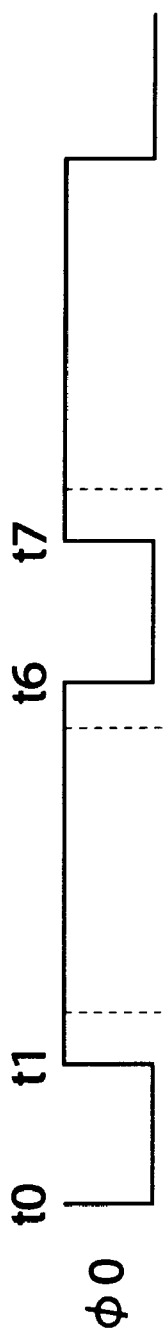
FIG.8A  φ0
FIG.8B  φK'
FIG.8C  φ0'
FIG.8D  φK+1'

70,70'

DELAY CIRCUIT FOR ANALOG SIGNALS

BACKGROUND OF THE INVENTION

1. Field of the Invention

This invention relates to a delay circuit for delaying analog signals, and more particularly to a delay circuit of this kind, which can be suitably integrated into integrated circuits.

2. Prior Art

Conventional delay circuits which are integrated into large scale integrated circuits (hereinafter referred to as "LSIs") include a type that is comprised of a plurality of memory cells formed of switches and capacitors and connected in parallel to each other, and operates such that the voltage of an analog signal is stored sequentially in the memory cells, and upon the lapse of a predetermined time period, the analog signal thus stored is read from the memory cells, to thereby delay the analog signal.

FIG. 1 shows the construction of the conventional delay circuit. In the figure, symbols M1 to Mn designate n memory cells connected in parallel to each other, for storing the voltage of an analog signal. The memory cell M1 is comprised of an input switch SW1, a capacitor C1, and an output switch SW1'. The other memory cells M2 to Mn are similarly constructed. Connected to outputs of the memory cells M1 to Mn is a voltage follower formed of an operational amplifier OP. In the figure, symbol Cp represents parasitic capacitance present at the output side of the memory cells M1 to Mn.

With the above construction, in writing an input analog signal Vin, the input switches Sw1 to Swn are sequentially turned on in the order of SW1→SW2→ . . . SWn→SW1 . . . to sample and hold the input analog signal Vin every sampling period so as to store the voltage of the input analog signal in the capacitors C1 to Cn. On the other hand, in reading out the input analog signal Vin thus stored, the output switches SW1' to SWn' are sequentially turned on in the order of SW1'→SW2'→ . . . SWn'→SW1' . . . to read out the stored input analog signal Vin sequentially from the memory cells M1 to Mn.

More specifically, the input analog signal Vin is sequentially written into the memory cells M1 to Mn-1, and then, at the next sampling timing the input analog signal Vin is written into the memory cell Mn and at the same time the input analog signal Vin stored in the memory cell M1 is read out, i.e. at delayed timing, to be output from the operational amplifier OP as an output analog signal Vout. In this way, the memory cells M1 to Mn repeatedly carry out writing operation and reading operation in a cyclic manner. Provided that the sampling time period (a time period during which each switch is on) is represented by Ts, the delay time Td can be expressed as Td=(n−1)×Ts.

In forming a delay circuit having the above described construction within an LSI, the following problem arises: That is, the capacitors C1 to Cn each have a capacitance value of several PFs so that they have high impedance even in a low-frequency region. Consequently, when the delay circuit undergoes disturbance or noise of low frequency (e.g. hum synchronous with the commercial alternating current), the voltage value of the capacitors C1 to Cn changes so that the input analog signal Vin read from the memory cells Ml to Mn has the noise of low frequency superimposed thereupon. If the frequency of the noise component is higher than the frequency band of the signal component, the noise component can be removed from the output analog signal Vout by the use of a low-pass filter. The low-frequency noise like hum, however, has a frequency falling within the frequency band of the output analog signal Vout and hence cannot be removed from the output analog signal Vout with ease. Therefore, even if a delay circuit having the above described construction is integrated into an LSI, the signal-to-noise ratio (SN) is degraded.

Further, the above-described delay circuit also has the disadvantage that the voltage stored in the capacitors C1 to Cn of the memory cells M1 to Mn cannot be accurately read out due to the presence of the parasitic capacitance Cp.

For example, when the switch SW1' is turned off after the voltage is read out from the capacitor C1 of the memory cell M1 with the switch SW1' being on, voltage across the parasitic capacitance Cp corresponds to the voltage which has been stored in the capacitor C1. In this state, voltage Vs" across the capacitor C2 of the next memory cell M2 which is actually read out from the capacitor C2 is given by the following formula:

$$Vs'' = (CaVs + CbVs')/(Ca+Cb)$$

where Vs' represents the voltage across the parasitic capacitance Cp, Cb the capacitance value of the parasitic capacitance Cp, Ca the capacitance value of the capacitor C2, and Vs the voltage across the capacitor C2 before the reading.

It will noted from the above formula that the intrinsic voltage Vs that is to be read out from the capacitor C2 changes to the voltage Vs" due to the action of the parasitic capacitance Cp. Besides, the capacitance value Cb of the parasitic capacitance Cp is dependent upon the voltage, and therefore the parasitic capacitance Cp also constitutes a factor for distortion of the output analog signal Vout.

SUMMARY OF THE INVENTION

It is a first object of the invention to provide a delay circuit for analog signals, which is capable of eliminating the influence of noise of low frequency as disturbance.

It is a second object of the invention to provide a delay circuit for analog signals, which is free from the influence of parasitic capacitance.

To attain the first object, according to a first aspect of the invention, there is provided a delay circuit comprising a plurality of memory cells including a plurality of capacitors, that store an analog signal as an input signal by storing charge of the input signal in the capacitors, a first inverting device that inverts the input signal to generate an inverted signal, a writing device that selects the input signal and the inverted signal alternately and sequentially writes the selected signals into the memory cells in a predetermined writing sequence, a reading device that sequentially reads out the input signal and the inverted signal from the memory cells in a sequence corresponding to the predetermined writing sequence, a second inverting device that inverts the inverted signal read out by the reading device, and a synthesizing device that synthesizes an output signal from the input signal read out by the reading device and an output signal of the second inverting device.

To attain the second object, according to a second aspect of the invention, there is provided a delay circuit comprising a plurality of memory cells including a plurality of capacitors, that store an analog signal as an input signal by storing charge of the input signal in the capacitors, the memory cells each having an output, a writing device that sequentially writes the input signal into the memory cells in a predetermined writing sequence, a negative feedback amplifier including a non-inverting input terminal disposed to receive constant voltage, an inverting input terminal connected to the output of each of the memory cells, an output terminal, and a feedback capacitor connected between the inverting input terminal and the output terminal, a reading device that performs reading operation of sequentially reading out the input signal from the memory cells in a sequence corresponding to the predetermined writing sequence, by causing charge stored in the capacitors of the memory cells to be moved into the feedback capacitor, and a resetting device that clears charge stored in the feedback capacitor before the reading operation of the reading device.

Preferably, the delay circuit according to the second aspect includes a sample-and-hold device that samples and holds an output of the negative feedback amplifier in synchronism with the reading operation of the reading device.

To attain the second object, according to a third aspect of the invention, there is provided a delay circuit comprising a plurality of memory cells including a plurality of capacitors, that store an input analog signal by storing charge of the input signal in the capacitors, a voltage-to-current converter that converts a voltage signal as the input analog signal into current to thereby generate an input current signal, a writing device that sequentially writes the input current signal into the memory cells in a predetermined writing sequence, a reading device that sequentially reads out the input current signal from the memory cells in a sequence corresponding to the predetermined writing sequence, and a current-to-voltage converter that converts the input current signal read out by the reading device into voltage to thereby generate an output voltage signal.

To attain the first and second objects, according to a fourth aspect of the invention, there is provided a delay circuit comprising a plurality of memory cells including a plurality of capacitors, that store an analog signal as an input signal by storing charge of the input signal in the capacitors, the memory cells each having an output, an inverting device that inverts the input signal to generate an inverted signal, a writing device that selects the input signal and the inverted signal alternately and sequentially writes the selected signals into the memory cells in a predetermined writing sequence, a reading device that sequentially reads out the input signal and the inverted signal from the memory cells in a sequence corresponding to the predetermined writing sequence, a first negative feedback amplifier including a non-inverting input terminal disposed to receive constant voltage, an inverting input terminal connected to the output of each of at least one of the memory cells into which the input signal is written, an output terminal, and a first feedback capacitor connected between the inverting input terminal and the output terminal, a second negative feedback amplifier including a non-inverting input terminal disposed to receive constant voltage, an inverting input terminal connected to the output of each of at least one of the memory cells into which the inverted signal is written, an output terminal, and a second feedback capacitor connected between the inverting input terminal and the output terminal, a reading device that performs reading operation of sequentially reading out the input signal and the inverted signal from the memory cells in a sequence corresponding to the predetermined writing sequence, by causing charge stored in the capacitors of the memory cells to be moved into the first and second feedback capacitors, a first resetting device that clears charge stored in the first feedback capacitor before the reading operation of reading out the input signal of the reading device, a second resetting device that clears charge stored in the second feedback capacitor before the reading operation of reading out the inverted signal of the reading device, and a synthesizing device that inverts an output signal of the second negative feedback amplifier and synthesizes an output signal from the inverted output signal and an output signal of the first negative feedback amplifier.

To attain the first and second objects, according to a fifth aspect of the invention, there is provided a delay circuit comprising a plurality of memory cells including a plurality of capacitors, that store an input analog signal by storing charge of the input analog signal in the capacitors, a first voltage-to-current converter that converts a voltage signal as the input analog signal into current to thereby generate an input current signal, an inverting device that inverts the voltage signal to thereby generate an inverted voltage signal, a second voltage-to-current converter that converts the inverted voltage signal into current to thereby generate an inverted input current signal, a writing device that selects the input current signal and the inverted input current signal alternately and sequentially writes the selected signals into the memory cells in a predetermined writing sequence, a reading device that sequentially reads out the input current signal and the inverted input current signal from the memory cells in a sequence corresponding to the predetermined writing sequence, and an output voltage signal generating device that generates an output voltage signal based upon the input current signal and the inverted input current signal read out by the reading device.

Preferably, in the delay circuit according to the fifth aspect, the output voltage signal generating device comprises a first current-to-voltage converter that subjects the input current signal read out by the reading device to current-to-voltage conversion, a second current-to-voltage converter that subjects the inverted input current signal read out by the reading device to current-to-voltage conversion, and a synthesizing device that synthesizes the output voltage signal from an output signal of the first current-to-voltage converter and an output signal of the second current-to-voltage converter.

Preferably, in the delay circuits according to the first, second and fourth aspects, the memory cells each comprise an input terminal, a first switch having one end thereof connected to the input terminal, a corresponding one of the capacitors connected between another end of the first switch and ground, an output terminal, and a second switch connected between the another end of the first switch and the output terminal.

Preferably, in the delay circuits according to the third and fifth aspects, the memory cells each comprise an input terminal, a first switch having one end thereof connected to the input terminal, an output terminal, a second switch connected between another end of the first switch and the output terminal, a corresponding one of the capacitors, a third switch connected between the another end of the first switch and one end of the corresponding one of the capacitors, and a field effect transistor having a gate thereof connected to the one end of the corresponding one of the capacitors, and a source and a drain thereof connected between another end of the corresponding one of the capacitors and the another end of the first switch.

The above and other objects, features, and advantages of the invention will become more apparent from the following detailed description taken in conjunction with the accompanying drawings.

BRIEF DESCRIPTION OF THE DRAWINGS

FIGS. 3A to 3K collectively form a timing chart useful in explaining the operation of the delay circuit according to the first embodiment, in which:

FIG. 3A shows an input analog signal Vin;

FIG. 3B shows a control signal $\phi 1$;

FIG. 3C shows a control signal $\phi 2$;

FIG. 3D shows a control signal $\phi 3$;

FIG. 3E shows a control signal $\phi n$;

FIG. 3F shows a control signal $\phi 1'$;

FIG. 3G shows a control signal $\phi 2'$;

FIG. 3H shows a control signal $\phi 3'$;

FIG. 3I shows a control signal $\phi n'$;

FIG. 3J shows a control signal $\phi 0$; and

FIG. 3K shows an output analog signal Vout;

FIGS. 4A to 4C collectively form a timing chart useful in explaining an operation of removing low-frequency noise according to the first embodiment, in which:

FIG. 4A shows a waveform of the input analog signal Vin;

FIG. 4B shows waveforms of the signal stored in memory cells M1 to M8; and

FIG. 4C shows noise voltage;

FIGS. 5A to 5C collectively form a timing charting useful in explaining the operation of removing low-frequency noise according to the first embodiment, in which:

FIG. 5A shows waveforms of the input analog signal Vin stored in the memory cells M1 to M8 with the noise voltage shown in FIG. 4C superimposed thereon;

FIG. 5B shows a waveform of an output analog signal Vout as well as a waveform of the input analog signal Vin; and FIG. 5C shows a waveform of a noise signal superimposed upon the output analog signal Vout;

FIGS. 7A to 7J collectively form a timing chart useful in explaining the operation of the delay circuit according to the second embodiment, in which:

FIG. 7A shows an input analog signal Vin;

FIG. 7B shows a control signal $\phi 1$;

FIG. 7C shows a control signal $\phi 2$;

FIG. 7D shows a control signal $\phi n$;

FIG. 7E shows a control signal $\phi 1'$;

FIG. 7F shows a control signal $\phi 2'$;

FIG. 7G shows a control signal $\phi n'$;

FIG. 7H shows voltage at a node A;

FIG. 7I shows a control signal $\phi 0'$; and

FIG. 7J shows an output analog signal Vout;

FIGS. 8A to 8D collectively form a timing chart useful in explaining an operation of reading from memory cells, in which:

FIG. 8A shows the control signal $\phi 0$;

FIG. 8B shows a control signal $\phi K'$; and

FIG. 8C shows a control signal $\phi K+1'$

FIGS. 10A to 10J collectively form a timing chart useful in explaining the operation of the delay circuit according to the third embodiment, in which:

FIG. 10A shows an input analog signal Vin;

FIG. 10B shows control signals $\phi 1$ and $\phi 1''$;

FIG. 10C shows control signals $\phi 2$ and $\phi 2''$;

FIG. 10D shows control signals $\phi n$ and $\phi n''$;

FIG. 10E shows a control signal $\phi 1'$;

FIG. 10F shows a control signal $\phi 2'$;

FIG. 10G shows a control signal $\phi n'$;

FIG. 10H shows input current Ii;

FIG. 10I shows output current Io; and

FIG. 10J shows an output analog signal Vout;

DETAILED DESCRIPTION

The invention will now be described in detail with reference to drawings showing embodiments thereof.

Figure 1:
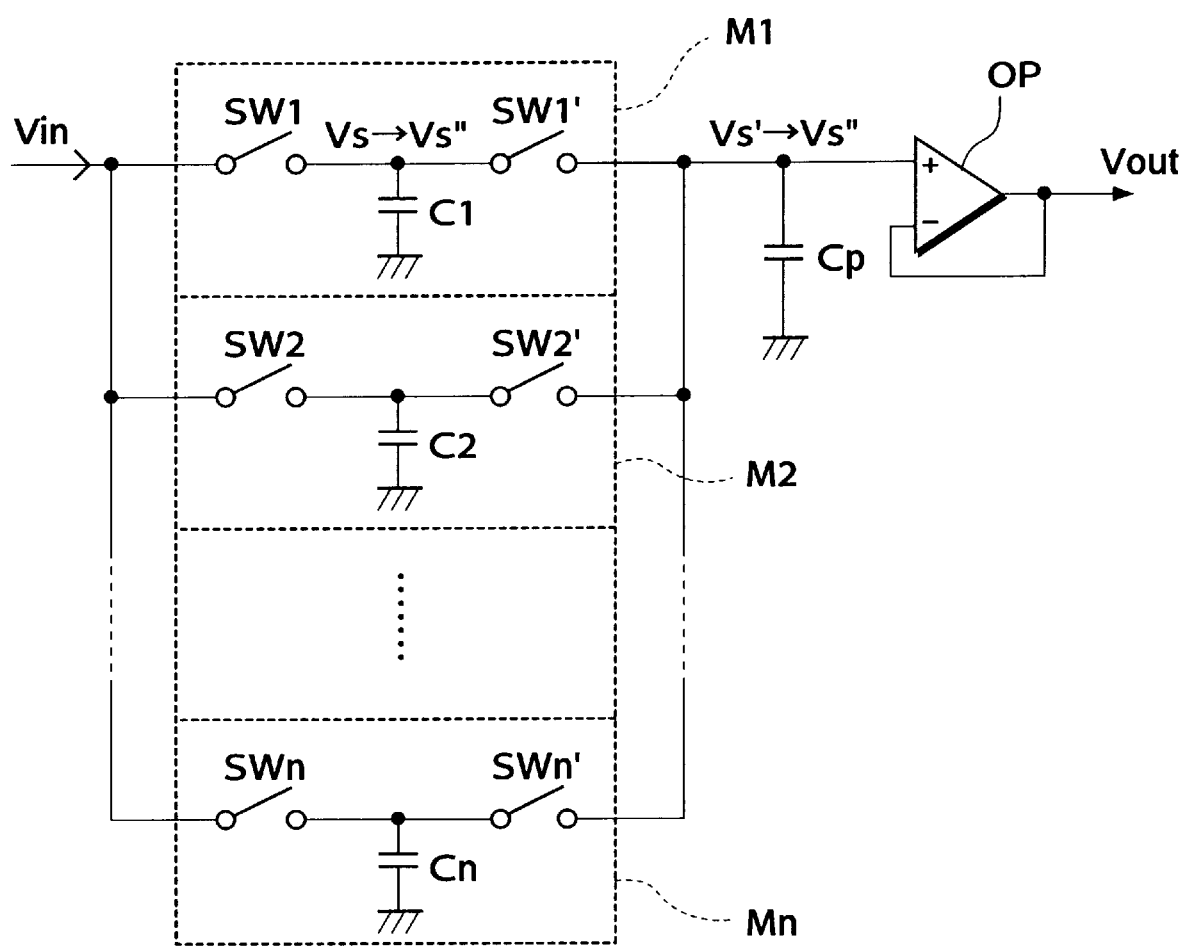
FIG. 1 is a circuit diagram showing the construction of a conventional delay circuit.
Figure 2:
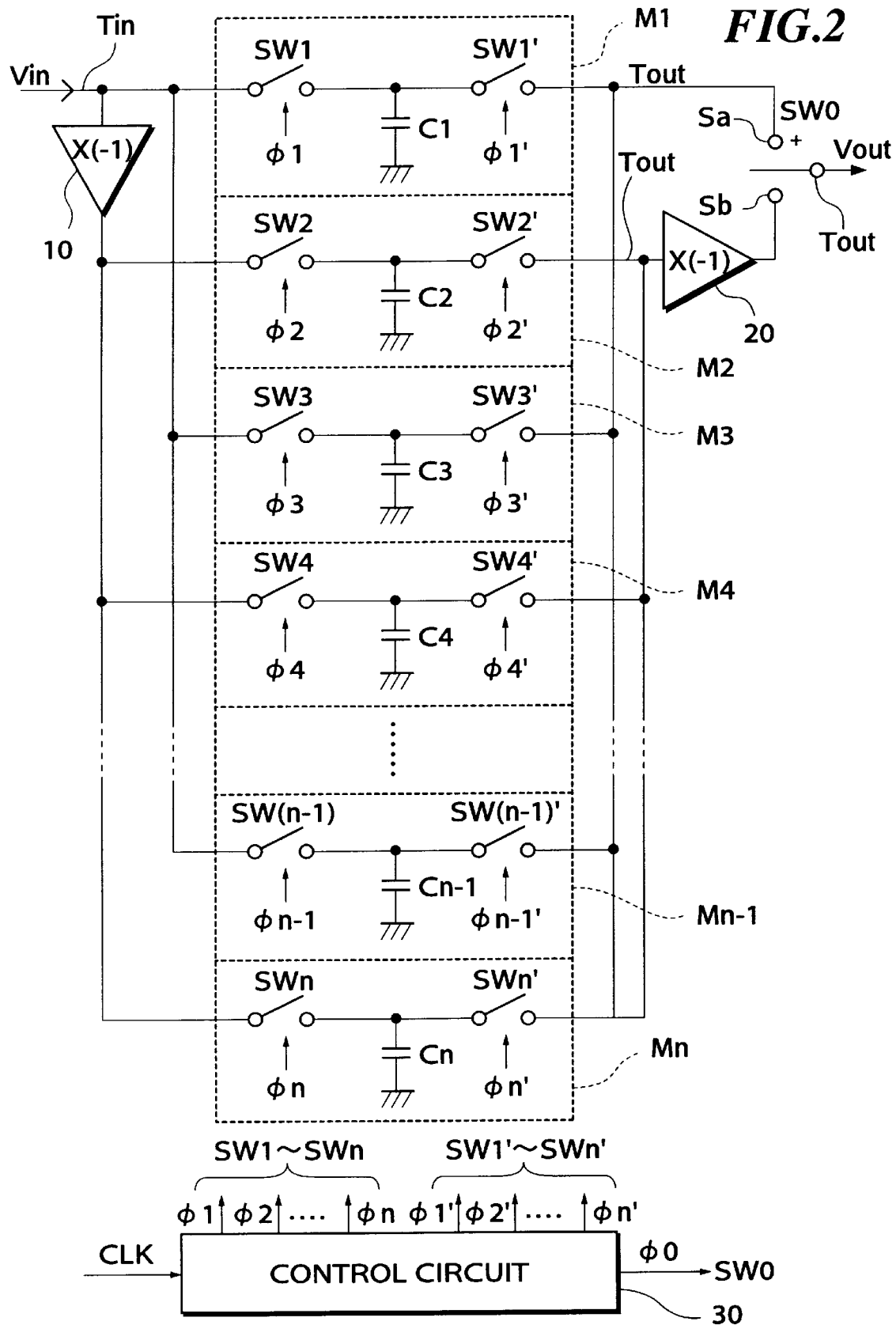
FIG. 2 is a circuit diagram showing the construction of a delay circuit according to a first embodiment of the present invention.

Referring first to FIG. 2, there is schematically shown the construction of a delay circuit according to a first embodiment of the invention.

In the figure, symbols M1 to Mn designate memory cells, which are each comprised of a capacitor C1 to Cn with one end thereof grounded, an input switch SW1 to SWn connected between the other end of the capacitor C1 to Cn and an input terminal Tin, and an output switch SW1' to SWn' connected between the other end of the capacitor C1 to Cn and an output terminal Tout. The input switches SW1 to SWn are controlled by respective control signals $\phi 1$ to $\phi n$ such that they are turned on when the control signals $\phi 1$ to $\phi n$ go high, and turned off when the latter go low. The output switches SW1' to SWn' are similarly controlled by respective control signals $\phi 1'$ to $\phi n'$, that is, they are turned on when the control signals $\phi 1'$ to $\phi n'$ go high, and turned off when the latter go low.

Reference numeral 10 designates an inverting circuit having a gain of 1, which has output impedance thereof set to a low value. The inverting circuit 10 is disposed to receive an input analog signal Vin at an input thereof, and an output thereof connected to the memory cells M2, M4, . . . Mn. Accordingly, the even-numbered memory cells M2, M4, . . . Mn are supplied with the input analog signal Vin after being inverted by the inverting circuit 10, so that the inverted input analog signal Vin is stored sequentially in the capacitors C2, C4, . . . Cn in accordance with operations of the input switches SW2, SW4, . . . SWn. On the other hand, the odd-numbered memory cells M1, M3, . . . Mn-1 are supplied with the input analog signal Vin at low impedance via a buffer circuit, not shown, so that the input analog signal Vin is stored sequentially in the capacitors C1, C3, . . . Cn-1 in accordance with operations of the input switches SW1, SW3, . . . SWn-1.

Next, reference numeral 20 designates an inverting circuit having a gain of 1, which is connected to outputs of the even-numbered memory cells M2, M4, . . . Mn. As mentioned above, the inverted input analog signal Vin is written into the memory cells M2, M4, Mn. After being read out from the memory cells M2, M4, Mn, the signal Vin is again inverted by the inverting circuit 20. Accordingly, an output signal from the inverting circuit 20 coincides in polarity with the input analog signal Vin.

Symbol SWO designates a switch which is controlled by a control signal $\phi0$ such that when the control signal $\phi0$ is at high level, it connects the output terminal Tout to a terminal Sa thereof, and when the control signal $\phi$ is at low level, it connects the output terminal Tout to a terminal Sb thereof. By the operation of this switch SW0, output signals from the odd-numbered memory cells M1, M3, . . . Mn-1 and output signals from the even-numbered memory cells M2, M4, Mn are alternately selected, whereby the output signals from the two groups of memory cells are synthesized into the output analog signal Vout which is delayed with respect to the input analog signal Vin.

Next, reference numeral 30 designates a control circuit which is composed of shift registefs or the like. The control circuit 30 is constructed so as to generate control signals $\phi1$ to $\phi n$, $\phi1'$ to $\phi n'$, and $\phi0$ for controlling the switches SW1 to SWn, SW1' to SWn', and SW0, respectively, based upon a clock signal CLK. The frequency of the clock signal CLK is set to a value twice or more as high as the signal band frequency of the input analog signal Vin. A low-pass filter, not shown, is provided at a later stage of the present delay circuit, for fully removing the clock component. This low-pass filter exhibits a flat frequency characteristic at a frequency band corresponding to that of the input analog signal Vin, and a sufficient attenuation characteristic at or in the vicinity of the sampling frequency.

With the above construction, in writing the input analog signal Vin, the switches SW1 to SWn are controlled to turn on sequentially in the order of SW1→SW2→ . . . SWn→SW1, whereby the input analog signal Vin is sampled and held in synchronism with the clock signal CLK. Then, in reading out the input analog signal Vin, the switches SW1' to SWn' are controlled to turn on sequentially in the order of SW1'→SW2'→ . . . SWn'→SW1', whereby the input analog signal Vin is read out in synchronism with the clock signal CLK. analog signutput analog signal Vout is generated and the clock component thereof is removed by the low-pass filter.

In the above operation, the input analog signal Vin is written sequentially into the memory cells M1 to Mn every sampling period. alternately in a non-inverted manner and in an inverted manner, and each portion of the input analog signal Vin that has been inverted and written is again inverted to be read out. When the delay circuit thus constructed undergoes disturbance or noise of low frequency, voltage stored in the capacitors C1 to Cn varies. However, in reading out the voltage stored in the memory cells M1 to Mn, the reading-out is carried out in the alternate non-inverted and inverted manner, so that the disturbance or noise superimposed upon the output analog signal Vout is modulated by the sampling frequency. Thus, the disturbance or noise is frequency-shifted to a frequency in the vicinity of the sampling frequency so that the above-mentioned low-pass filter can remove the disturbance or noise.

Next, the operation of the delay circuit according to the first embodiment will be described. FIGS. 3A to 3K collectively form a timing chart useful in explaining the operation of the delay circuit according to the first embodiment. Assuming that the input analog signal Vin starts to be supplied to the delay circuit at a time point t0 as shown in FIG. 3A, the control signal $\phi1$ as shown in FIG. 3B is applied to the input switch SW1. Since the input switch SW1 is turned on when the control signal $\phi0$ goes high, as mentioned above, a portion of the input analog signal Vin is loaded into the memory cell M1, which corresponds to a time period from time point t0 to time point t1 during which the control signal $\phi1$ is on. The control signals $\phi2$ to $\phi n$ are sequentially shifted in timing with respect to the control signal $\phi1$ by the sampling period, as shown in FIGS. 3B to 3E. Therefore, writing of the input analog signal Vin is sequentially carried out into the memory cells M1 to Mn in the order of M1→M2→ . . . Mn. However, as to the even-numbered memory cells M2, M4, . . . Mn-1, the input analog signal Vin is written into them in an inverted form.

If it is assumed that the set delay time is 7 times as long as the sampling period, the control signal $\phi1'$ is generated at timing as shown in FIG. 3F, and accordingly the output switch SW1' is turned and held on from time point t7 to time point t8, whereby the voltage stored in the capacitor C1 of the memory cell M1 is read out. The control signals $\phi2'$ to $\phi n'$ are sequentially shifted in timing with respect to the control signal $\phi1'$ by the sampling period, as shown in FIGS. 3G to 3I. Therefore, reading-out of the input analog signal Vin is sequentially carried out from the memory cells M1 to Mn in the order of M1→M2→ . . . Mn.

After signals have been thus read out from the memory cells M1 to Mn, signals read out from the odd-numbered memory cells are supplied to the terminal Sa of the switch SW0, and signals read from the even-numbered memory cells are supplied to the terminal Sb of the switch SW0 via the inverting circuit 20. The switch SW0 selects the terminal Sa when the control signal $\phi0$ is at high level, and the terminal Sb when the latter is at low level, as mentioned above. As the switch SW0 is controlled by the control signal $\phi0$, the output analog signal Vout is obtained as shown in FIG. 3K. For example, in a time period from time point t7 to t8, a final value of the input analog signal Vin written at the time point t0 to time point t1 (exactly, a value obtained at time point t1) is generated.

Figure 4A:
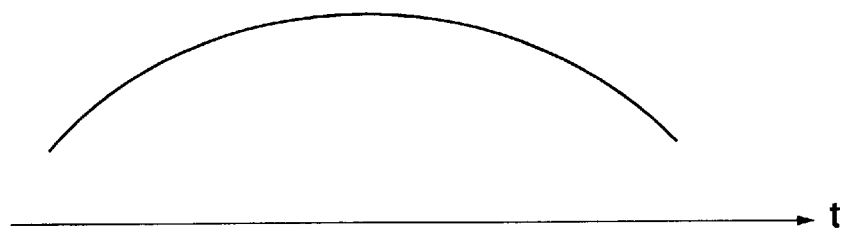
Figure 4B:
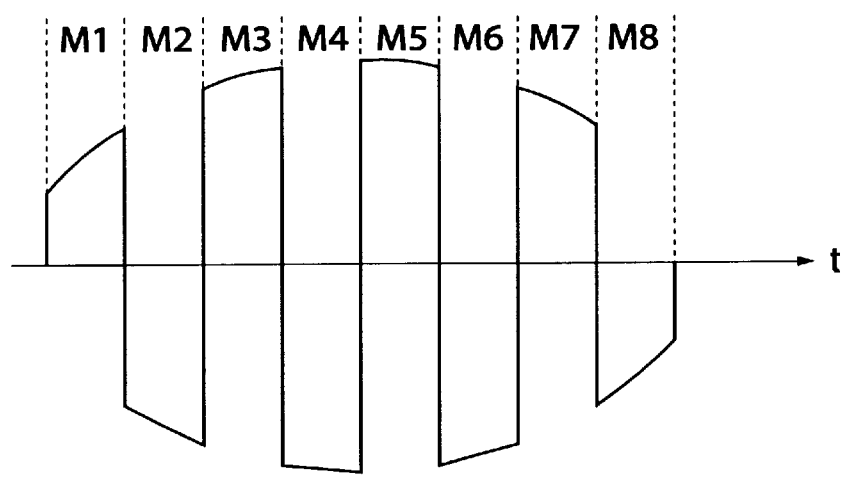

Next, the operation of removing low-frequency noise will be described with reference to FIGS. 4A to 4C and FIGS. 5A to 5C. Waveforms shown in these figures are depicted with holding effects of the capacitors omitted, for the sake of simplicity. Assuming that the input analog signal Vin having a waveform as shown in FIG. 4A is supplied to the delay circuit, signals that are stored in the memory cells M1 to M8 are each inverted with respect to its preceding signal every sampling period, as shown in FIG. 4B.

Since as mentioned before, the capacitance value of each of the capacitors C1 to Cn provided in the LSI is several PFs, the impedance of each capacitor C1 to Cn is high even in a low-frequency region, and accordingly the holding voltage of the capacitors C1 to Cn varies depending upon low-frequency noise such as hum. For example, if noise voltage as shown in FIG. 4C is superimposed upon the signals stored in the capacitors C1 to C8 of the memory cells M1 to M8, the signals have waveforms as shown in FIG. 5A.

Figure 4C:
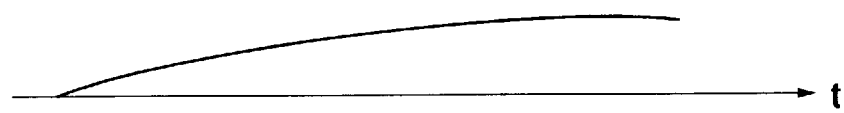
Figure 5A:
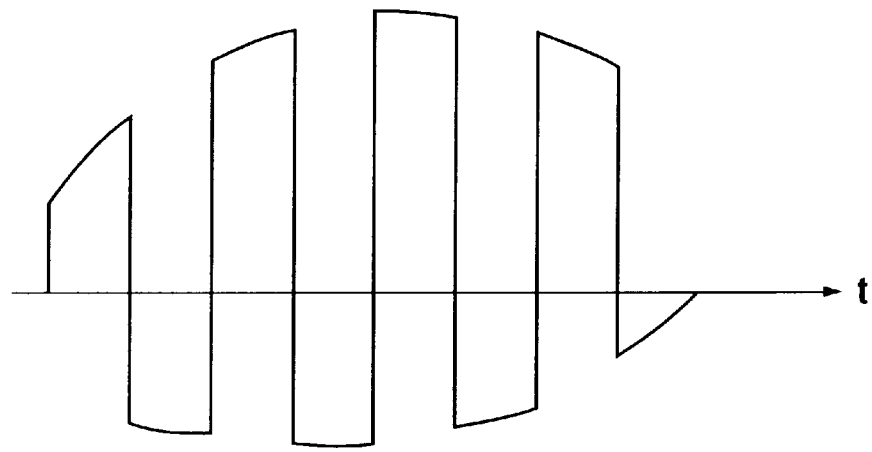
Figure 5B:
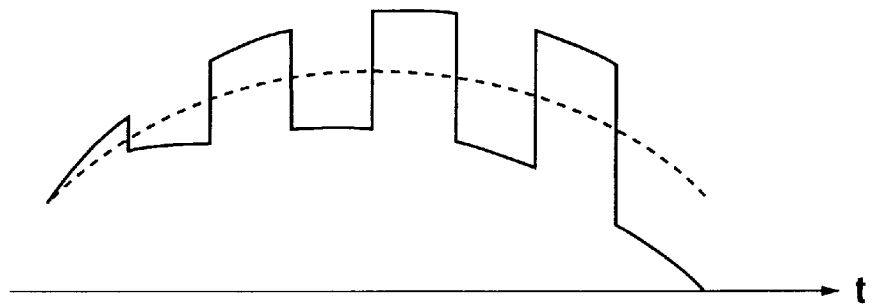
Figure 5C:
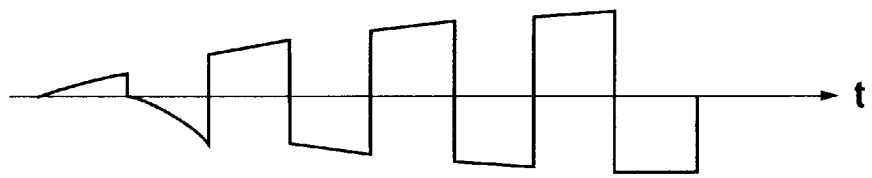

Accordingly, the output analog signal Vout then obtained has a waveform as shown by the solid line in FIG. 5B. The noise component amounts to the difference between the input analog signal Vin indicated by the broken line and the output analog signal Vout indicated by the solid line, and hence the noise signal superimposed upon the output analog signal Vout has a waveform as shown in FIG. 5C. Comparing between the noise signal in FIG. 4C and the noise signal in FIG. 5C, it will be understood that the noise signal in FIG.

5C has been obtained by modulation of the noise signal in FIG. 4C by the sampling frequency. That is, according to the present delay circuit, a low-frequency noise component can be frequency-converted to a higher frequency in the vicinity of the sampling frequency. For example, if the sampling frequency is represented by fs, and the frequency of the original noise signal by fn, the frequency of the frequency-converted noise signal is fs−fn and fs+fn.

The noise signal thus frequency-converted to a frequency in the vicinity of the sampling frequency is removed by the low-pass filter for removing the sampling frequency component, referred to before. Thus, the noise signal superimposed upon the output analog signal Vout can be removed from the latter.

As described above, according to the present embodiment, the input analog signal Vin is written into the memory cells M1 to Mn in a manner being inverted with respect to adjacent ones, and read out from the memory cells in a manner being inverted with respect to adjacent ones. As a result, even if low-frequency noise passes into the memory cells when they store the input analog signal Vin, the low-frequency noise can be frequency-converted to a frequency in the vicinity of the sampling frequency, which makes it possible to remove or separate the low-frequency noise from the output analog signal Vout, to thereby improve the signal-to-noise ratio, which was impossible according to the prior art.

Next, a delay circuit according to a second embodiment of the invention will be described.

Figure 6:
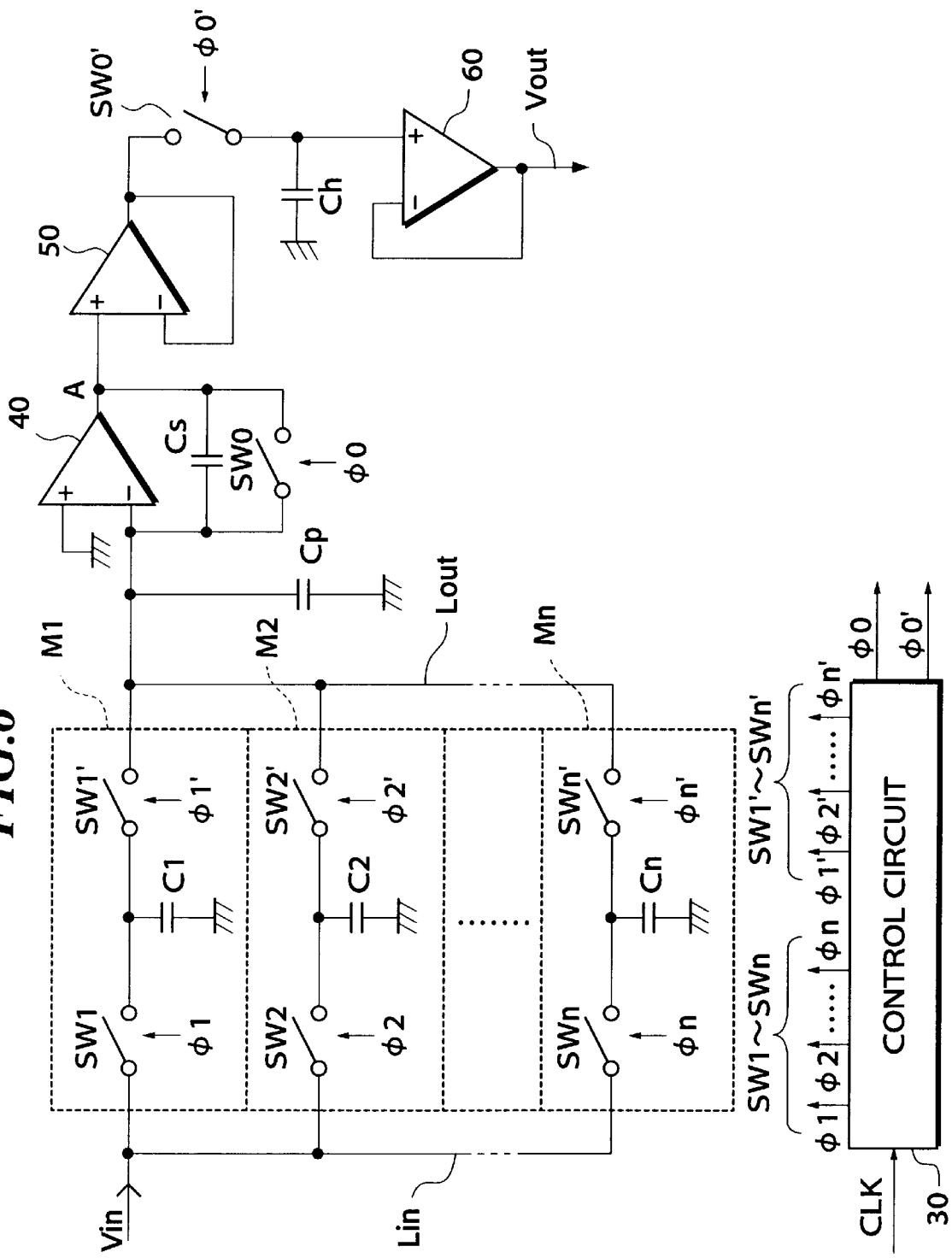
FIG. 6 is a circuit diagram showing the construction of a delay circuit according to a second embodiment of the present invention.

FIG. 6 shows the construction of the delay circuit according to the second embodiment.

In the figure, the memory cells M1 to Mn have an identical construction with that in the first embodiment. In the present embodiment, the memory cells M1 to Mn are connected in parallel with each other, with inputs thereof connected to an input line Lin, and outputs thereof connected to an output line Lout. Parasitic capacitance Cp which is dependent upon voltage is present between the output line Lout and ground.

Connected to the output line Lout is an operational amplifier 40, which has a capacitor Cs and a switch SW0 connected in parallel between an inverting input terminal thereof and an output terminal thereof, with a non-inverting input terminal thereof being grounded. The operational amplifier 40 is a type that has high input impedance and a sufficiently high gain. Therefore, the inverting input terminal and non-inverting input terminal of the operational amplifier 40 are in the relation of imaginary short. Accordingly, the voltage at the inverting input terminal is always constant, i.e. at ground level in the illustrated embodiment.

In reading out voltage stored in the memory cell M1, the input switch SW1 and the switch SW0 are turned and held off, and with the switches SW1 and SW0 thus in the off state, the output switch SW1' is turned on. Since the output line Lout is in an imaginary ground condition, if the switches are operated as mentioned above, the charge stored in the capacitor C1 is moved into the capacitor Cs. The capacitance value of the capacitor Cs is set to a value equal to the capacitance value of the capacitors C1 to Cn. Accordingly, voltage at a node A becomes equal to the voltage stored in the capacitor C1. Thus, the voltage stored in the memory cells M1 to Mn can be read out without being affected by the parasitic capacitance Cp.

In reading out the voltage stored in the next memory cell, however, if the charge read out from the preceding memory cell is then stored in the capacitor Cs, the voltage stored in the next memory cell and the voltage stored in the preceding memory cell are added together in the capacitor Cs. Therefore, it is necessary to clear the charge stored in the capacitor Cs each time voltage is read out from each memory cell M1 to Mn. The switch SW0 is provided for this purpose, and turned on just before voltage is read out from the next memory cell to clear the charge stored in the capacitor Cs.

Since the voltage in the capacitor Cs is thus cleared each time voltage is read out from each memory cell M1 to Mn, the voltage at the node A changes in a chopper-like manner in synchronism with the operation of the switch SW0. Therefore, in the illustrated embodiment, a sample-and-hold circuit is provided to convert the voltage at the node A into a continuous form to thereby generate the output analog signal Vout. More specifically, an operational amplifier 50 and an operational amplifier 60, which each form a voltage follower, a switch SW0', and a capacitor Ch cooperate to constitute the sample-and-hold circuit.

Reference numeral 30 designates a control circuit which is composed of shift registers or the like. The control circuit 30 is constructed so as to generate control signals φ1 to φn, φ1' to φn', φ0, and φ0' for controlling the switches SW1 to SWn, SW1' to SWn', SW0, and SW0', respectively, based upon a clock signal CLK. A low-pass filter, not shown, is provided at a later stage of the present delay circuit, for fully removing the clock component, similarly to the first embodiment. This low-pass filter exhibits a flat frequency characteristic at a frequency band corresponding to that of the input analog signal Vin, and a sufficient attenuation characteristic at or in the vicinity of the sampling frequency.

Next, the operation of the delay circuit according to the second embodiment will be described. FIGS. 7A to 7J collectively form a timing chart useful in explaining the operation of the delay circuit according to the second embodiment. When the input switches SW1 to SWn are sequentially controlled by the respective control signals φ1 to φn as shown in FIGS. 7B to 7D, voltage at each sampling timing is sequentially stored in the respective memory cells such that a portion of the input analog signal Vin at time point t1 is stored into the memory cell M1, the next portion of the signal at time point t2 into the memory cell M2, and so forth.

Then, as the control signals φ1' to φn' are sequentially generated as shown in FIGS. 7E to 7G, voltage is sequentially read out from the memory cells M1 to Mn, so that the voltage at the node A assumes a chopper-like waveform as shown in FIG. 7H. The voltage at the node A is sampled and held in response to the control signal φ0' as shown in FIG. 7I, to obtain the output analog signal Vout as shown in FIG. 7J.

The reading operation will be described in further detail with reference to FIGS. 8A to 8D. FIG. 8A shows timing of generation of the control signal φ0. While this control signal is low, the switch SW0 is in on state, whereas if the former is high, the latter is in off state. In the illustrated example, during a time period from time point t0 to time point t1, the switch SW0 is in on state, so that the charge in the capacitor Cs is cleared. The time period during which the switch SW0 is in on state is set by taking into consideration the time constant determined by the capacitance value of the capacitor Cs and the on-state resistance of the switch SW0, to such a value that the charge stored in the capacitor Cs can be fully cleared. Thus, at the time point t1 the charge in the capacitor Cs is fully cleared, to prepare for reading from the memory cells.

Thereafter, in reading out voltage from a k-th memory cell, a control signal φk' is supplied to a corresponding output switch SWk, as shown in FIG. 8B. This control signal φk' changes from low level into high level at time point t2 after the control signal φ0 has changed from low level into high level to turn the switch SW0 off. Accordingly, the capacitor Ck of the k-th memory cell Mk and the output line Lout are connected to each other, so that the charge stored in the capacitor Ck is moved into the capacitor Cs. Since the inverting input terminal of the operational amplifier 40 is in an imaginary ground condition, the charge does not move into the parasitic capacitance Cp, whereby the total charge can be moved into the capacitor Cs. As a result, the voltage stored in the memory cell can be accurately read out without being affected by the parasitic capacitance Cp.

After the charge has thus been moved into the capacitor Cs, at time point t4, the control signal φk' changes from high level into low level, whereupon the output switch SWk' is turned off. Further, at the time point t4, the control signal φ0' changes from low level into high level to turn the switch SW0' on, whereby the voltage at the node A is moved into and held in the capacitor Ch. Then, at time point t5, the control signal φ0' changes from high level into low level to turn the switch SW0' off, whereby the voltage is held in the capacitor Ch until the switch SW0' is again turned on.

Then, at time point t6, the control signal φ0 changes from high level into low level to again turn the switch SW0 on, so that the charge stored in the capacitor Cs is cleared. Then, at time point t7, the switch SW0 is turned off to complete preparation for reading from a k+1-th memory cell k+1, and then, at time point t8, a control signal φk+1 changes from low level into high level, so that voltage stored in the k+1-th memory cell Mk+1 is read out. Thereafter, similar operations are repeatedly carried to sequentially read out voltage from the memory cells M1 to Mn.

As described above, according to the present embodiment, the operational amplifier 40 is provided in an imaginary ground condition at the output sides of the memory cells M1 to Mn, and the charge stored in the capacitor Cs is cleared every sampling period, making it possible to accurately read out voltage stored in the memory cells M1 to Mn without being affected by the parasitic capacitance Cp. Particularly, in a delay circuit employing several hundreds or several thousands of memory cells arranged in parallel, in which the parasitic capacitance Cp has an increased value, a remarkable improvement in the quality of the output analog signal Vout can be achieved.

A third embodiment of the invention will now be described.

While in the above described first and second embodiments, the input analog signal Vin is stored in the memory cells M1 to Mn in voltage mode, in the third embodiment, the input analog signal Vin is stored in memory cells in current mode.

Figure 9:
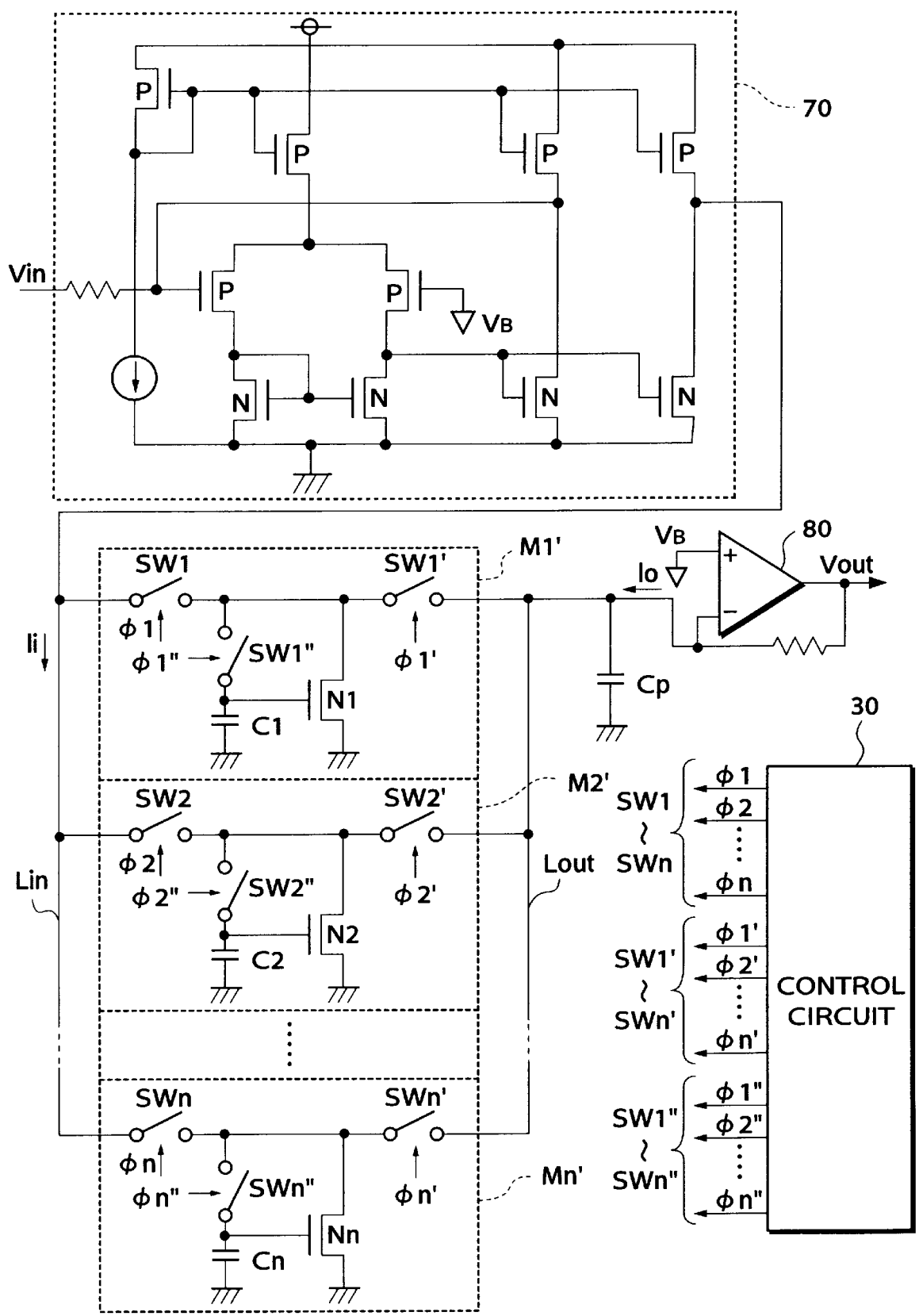
FIG. 9 is a circuit diagram showing the construction of a delay circuit according to a third embodiment of the present invention.

FIG. 9 shows the construction of a delay circuit according to the third embodiment. In the figure, reference numeral 70 designates a voltage-to-current converter 70 which is formed of a current mirror circuit, etc., for carrying out well-known voltage-to-current conversion, i.e. for generating input current Ii corresponding to the voltage of the input analog signal Vin.

Memory cells M1' to Mn' correspond in arrangement to the memory cells M1 to Mn in the first and second embodiments, but differ from the latter in that they store current values instead of voltage values. The memory cells M1' to Mn' are each comprised of an input switch SW1 to SWn with one end thereof connected to an input line Lin, an output switch SW1' to SWn' connected between the other end of the input switch SW1 to SWn and an output line Lout, a switch SW1" to SWn" with one end thereof connected to the other end of the input switch SW1 to SWn, a capacitor C1 to Cn connected between the other end of the switch SW1" to SWn" and ground, an N-channel FET N1 to Nn with a source thereof connected to the other end of the input switch SW1 to SWn, a gate thereof connected to the capacitor C1 to Cn, and a drain thereof grounded. The input switch SW1 to SWn, output switch SW1' to SWn', and switch SW1" to SWn" are controlled such that they are turned on when their respective control signals φ1 to φn, φ1' to φn', and φ1" to φn" go high, and turned off when these signals go low.

For example, in writing input current Ii into the memory cell M1', the input switch SW1 and the switch SW1" are turned on, and the output switch SW1' is turned off. Then, the input current Ii flows to ground through the N-channel FET N1. On this occasion, the voltage value of the capacitor C1 (gate voltage value) assumes a value just enough for the N-channel FET N1 to allow the input current Ii to flow therethrough. Upon termination of the writing period, the input switch SW1 and the switch SW1" are turned off. Since the gate of the N-channel FET NB1 has very high impedance, voltage stored in the capacitor C1 at the termination of the writing period is held in the capacitor C1. That is, voltage corresponding to the input current Ii is stored in the capacitor C1.

On the other hand, in reading out current from the memory cell M1', the input switch SW1 and the switch SW1" are turned off, and the output switch SW1' is turned on. Then, the N-channel FET N1 draws in output current Io in an amount corresponding to the voltage of the capacitor C1 (gate voltage) from the output line Lout. The output current Io does not vary due to the influence of the parasitic capacitance Cp, and therefore the current value stored in the memory cell can be accurately read out.

In FIG. 9, reference numeral 80 designates a current-to-voltage converter, which is composed of an operational amplifier, and a resistance. The current-to-voltage converter 80 converts the output current Io into voltage, which is output as the output analog signal Vout.

Reference numeral 30 designates a control circuit which is composed of shift registers or the like. The control circuit 30 is constructed so as to generate control signals φ1 to φn, φ1' to φn', and φ1" to φn", for controlling the switches SW1 to SWn, SW1' to SWn', and SW1" to SWn", respectively, based upon a clock signal CLK. A low-pass filter, not shown, is provided at a later stage of the present delay circuit, for fully removing the clock component. This low-pass filter exhibits a flat frequency characteristic at a frequency band corresponding to that of the input analog signal Vin, and a sufficient attenuation characteristic at or in the vicinity of the sampling frequency.

Figure 10:
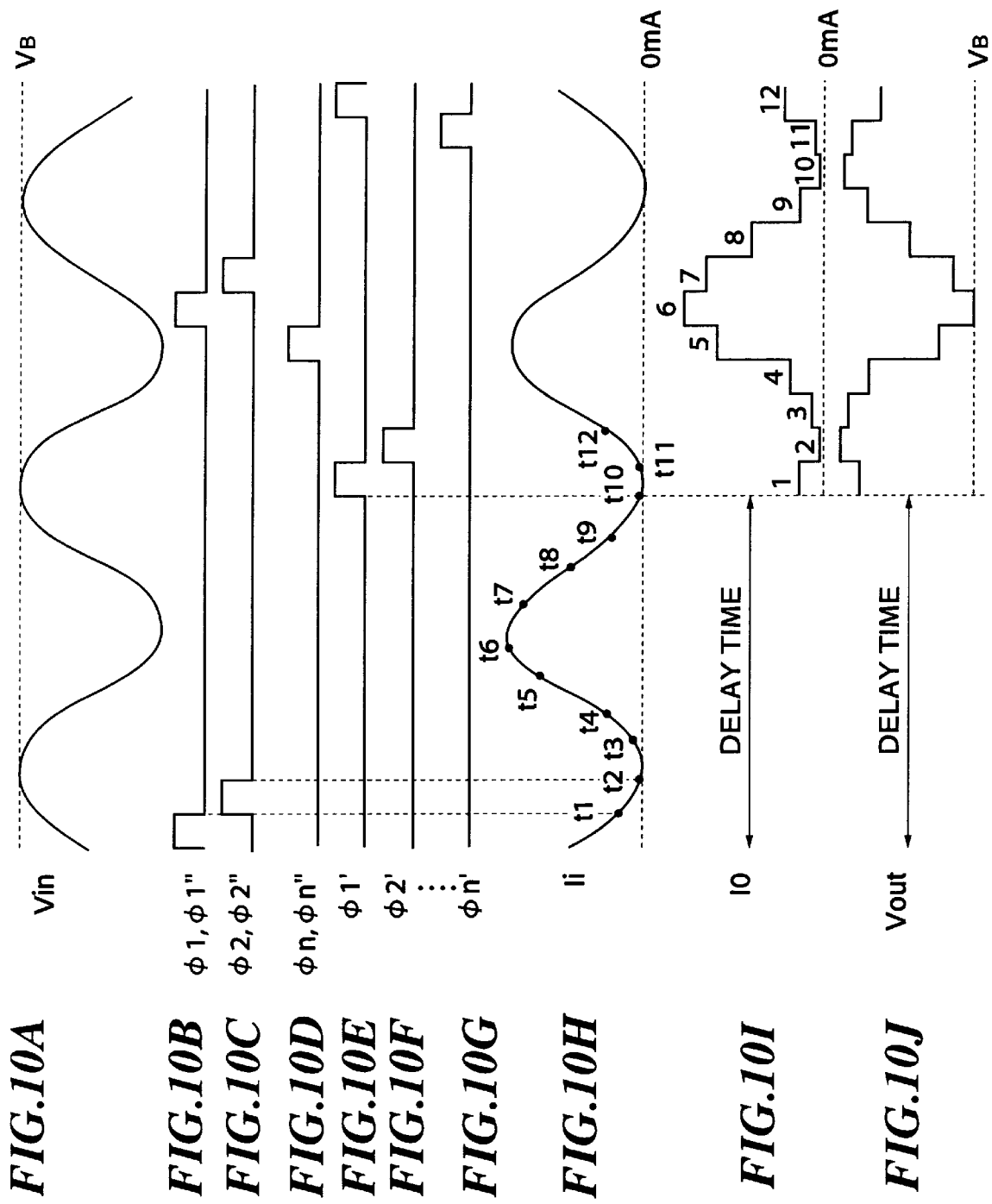

Next, the operation of the third embodiment constructed as above will be described. FIGS. 10A to 10J collectively form a timing chart useful in explaining the operation of the third embodiment. In the illustrated example, when the input analog signal as shown in FIG. 10A is supplied to the present delay circuit, it is converted into input current Ii as shown in FIG. 10H. The input switches SW1 to SWn are controlled by the respective control signals φ1 to φn as shown in FIGS. 10B to 10D, and the switches SW1" to SWn" are controlled by the respective control signals φ1 to φn" as shown in FIGS. 10B to FIG. 10D. Accordingly, the current value is sequentially stored in each memory cell at each timing of generation of each control signal, such that the value of input current Ii at time point t1 is stored in the memory cell M1, the value of input current Ii at time point t2 is stored in the memory cell M2, and so forth. In the illustrated example, it is assumed that the pulse width of the control signals $\phi 1$ to $\phi n$ is equal to that of the control signals $\phi 1''$ to $\phi n''$. However, the pulse width of the control signals $\phi 1$ to $\phi n$ may be slightly larger than that of the control signals $\phi 1'$ to $\phi n''$.

Then, the control signals $\phi 1'$ to $\phi n'$ as shown in FIGS. 10E to 10F are supplied to the switches SW1' to SWn' to sequentially turn the switches SW1' to SWn' on, so that output current Io is drawn into the respective corresponding N-channel FETs N1 to Nn in amounts corresponding to the gate voltage values of the respective corresponding N-channel FETs N1 to Nn. The gate voltage of each N-channel FET N1 to Nn is given by the voltage of a corresponding one of the capacitors C1 to Cn, each capacitor storing voltage which assumes a value just enough to enable the N-channel FET to drawn in the input current Ii at the termination of the writing period. Accordingly, each N-channel FET N1 to Nn draws in the output current Io in an amount just corresponding to the value of the input current Ii stored in the corresponding capacitor C1 to Cn, from the output line Lout. Consequently, the output current Iout is obtained as shown in FIG. 10I. The thus obtained output current Iout is converted into voltage by the current-to-voltage converter 80, to obtain the output analog signal Vout as shown in FIG. 10J.

As described above, according to the present embodiment, the input analog signal Vin is subjected to voltage-to-current conversion, the resulting current values are stored in the memory cells M1' to Mn', and the output analog signal Vout is generated by reading out the stored current values. As a result, it is possible to accurately read out current from the memory cells M1' to Mn' without being affected by the parasitic capacitance Cp, to thereby obtain a high-quality output analog signal Vout.

Further, while in the second embodiment in which in reading out voltage from each memory cell M1 to Mn, the charge stored in the corresponding capacitor C1 to Cn is moved into the capacitor Cs, reading-out from each memory cell M1 to Mn can be carried out only one time, in the third embodiment in which reading-out from each memory cell M1' to Mn' is made in current mode, the reading-out from each memory cell can be carried out a plurality of times.

Further, according to the third embodiment, a value of voltage is stored in each capacitor C1 to Cn, which is just enough to enable the input current Ii to flow through the corresponding N-channel FET N1 to Nn. As a result, variations are allowable in capacitance value between the capacitors C1 to Cn. Besides, the capacitors C1 to Cn can be very small in capacitance value and therefore may be each replaced by the parasitic capacitance of the gate of the corresponding FET, thus making it unnecessary to specially prepare or form the capacitors C1 to Cn in the LSI.

Next, a fourth embodiment of the invention will be described.

The fourth embodiment is a combination of the first embodiment and the second embodiment.

Figure 11:
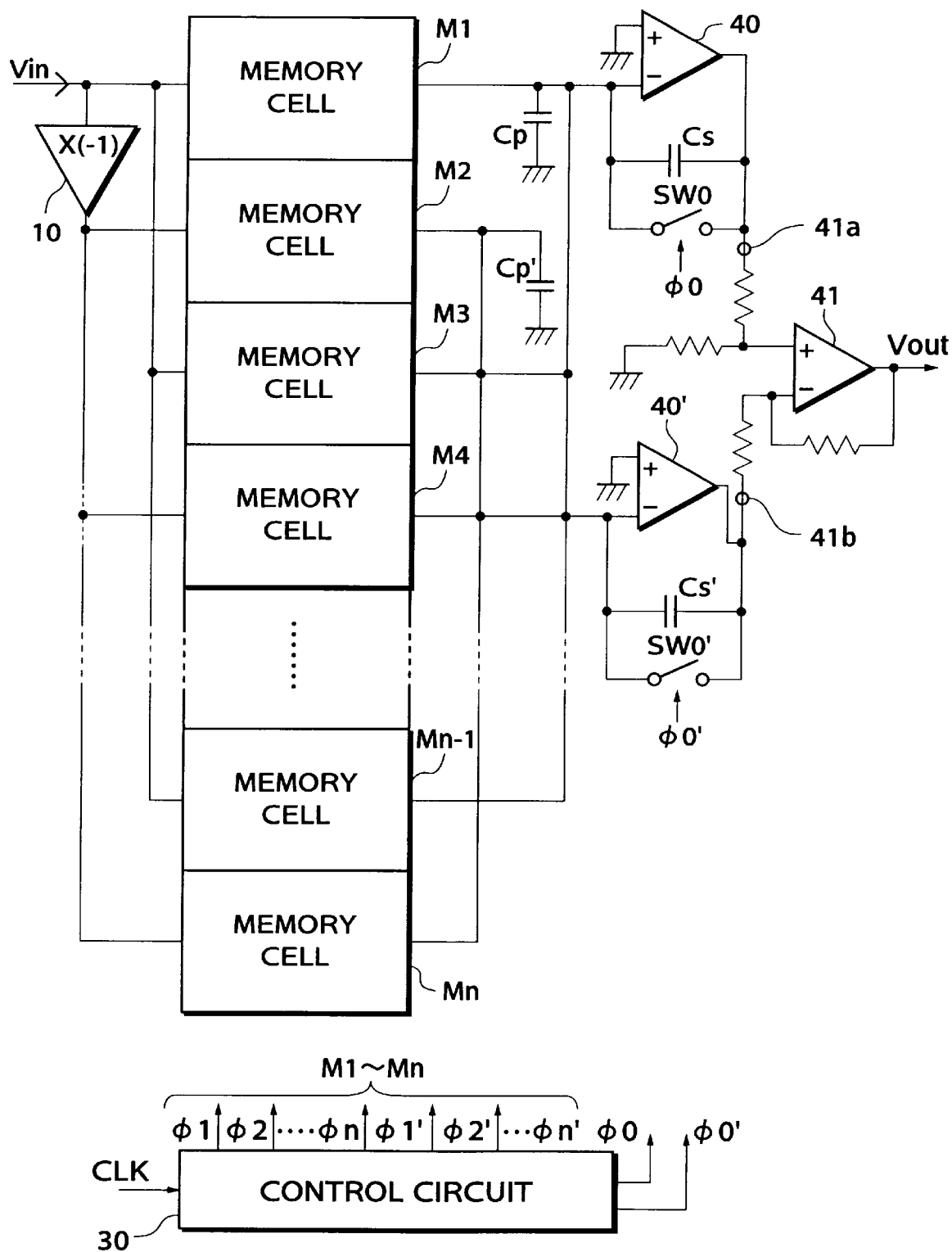
FIG. 11 is a circuit diagram showing the construction of a delay circuit according to a fourth embodiment of the present invention.

FIG. 11 shows the construction of a delay circuit according to the fourth embodiment. In the figure, elements and parts corresponding to those in FIGS. 2 and 6 are designated by identical reference numerals and symbols.

In the illustrated embodiment, an input analog signal Vin is directly supplied to odd-numbered memory cells M1, M3, ... Mn-1, and supplied to even-numbered memory cells M2, M4, ... Mn after being inverted by an inverting circuit 10, similarly to the first embodiment. Therefore, the input analog signal Vin is written sequentially into the memory cells M1 to Mn every sampling period alternately in a non-inverted manner and in an inverted manner.

An operational amplifier 40 which is imaginarily grounded is connected to the outputs of the odd-numbered memory cells M1, M3, ... Mn-1, and an operational amplifier 40' which is imaginarily grounded is connected to the outputs of the even-numbered memory cells M2, M4, ... Mn, similarly to the second embodiment. With this arrangement, the potentials at the inverting input terminals of the operational amplifiers 40, 40' are always at ground level, which makes it possible to read out the input analog signal Vin stored in the memory cells M1 to Mn without being affected by the parasitic capacitance Cp and parasitic capacitance Cp' present between the memory cells M1 to Mn and ground. Switches SW0, SW0' which are connected in parallel with capacitors Cs, Cs' are turned on before voltage is read out from the next memory cell, to thus act as resetting means for clearing the charge.

Provided at the output sides of the operational amplifiers 40, 40' is an adder 41 which has a non-inverting input terminal 41a, and an inverting input terminal 41b. The adder 41 is composed of an operational amplifier, and a resistance, and disposed to receive an output signal of the operational amplifier 40 at its non-inverting input terminal, and an output signal of the operational amplifier 40' at its inverting input terminal. With this arrangement, signals output from the even-numbered memory cells M2, M4, ... Mn are again inverted and then added together with signals output from the odd-numbered memory cells M1, M3, ... Mn-1, and the resulting sum signal is generated as the output analog signal Vout.

A control circuit 30 generates control signals $\phi 1$ to $\phi n$, $\phi 1'$ to $\phi n'$, $\phi 0$, and $\phi 0'$ based upon a clock signal CLK. A low-pass filter, not shown, is provided at a later stage of the present delay circuit, for fully removing the clock component. This low-pass filter exhibits a flat frequency characteristic at a frequency band corresponding to that of the input analog signal Vin, and a sufficient attenuation characteristic at or in the vicinity of the sampling frequency.

Therefore, in this embodiment, too, similarly to the first embodiment, even if low-frequency noise passes into the memory cells M1 to Mn, the low-frequency noise can be frequency-converted to a frequency in the vicinity of the sampling frequency, which makes it possible to remove or separate the low-frequency noise, which could not be removed according to the prior art, from the output analog signal Vout, to thereby improve the signal-to-noise ratio. Further, similarly to the second embodiment, voltage stored in the memory cells can be read out without being affected by the parasitic capacitance.

As described above, according to the fourth embodiment, two advantages of removal of low-frequency noise as achieved by the first embodiment and elimination of adverse effect of the parasitic capacitance as achieved by the second embodiment can be provided, thereby enabling generation of a higher-quality output analog signal.

Next, a fifth embodiment of the invention will be described.

The fifth embodiment is a combination of the first embodiment and the third embodiment.

Figure 12:
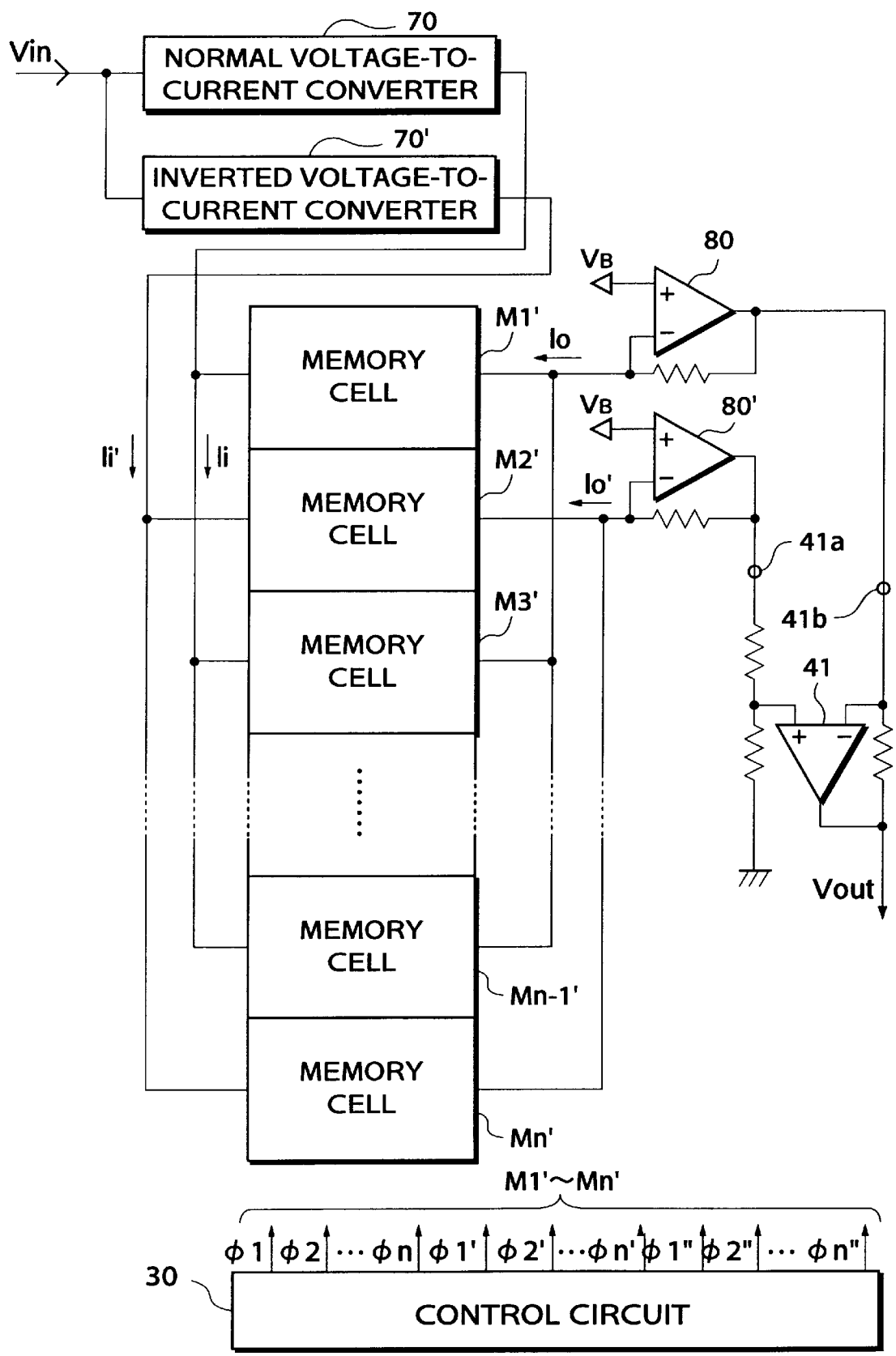
FIG. 12 is a circuit diagram showing the construction of a delay circuit according to a fifth embodiment of the present invention.

FIG. 12 shows the construction of a delay circuit according to the fifth embodiment. In the figure, elements and parts corresponding to those in FIGS. 2 and 9 are designated by identical reference numerals and symbols.

In the present embodiment, the voltage value of an input analog signal Vin is converted into a current value by a normal or non-inverted voltage-to-current converter 70 and supplied as non-inverted input current Ii to odd-numbered memory cells M1', M3', . . . Mn-1'. On the other hand, the input analog signal Vin is inverted and converted into a current value by an inverted voltage-to-current converter 70' and supplied as inverted input current Ii' to even-numbered memory cells M2', M4', . . . Mn'. Thus, current corresponding to the input analog signal Vin is written sequentially into the memory cells M1' to Mn' every sampling period, alternately in a non-inverted manner and in an inverted manner.

Connected to the outputs of the odd-numbered memory cells M1', M3', . . . Mn-1' and the outputs of the even-numbered memory cells M2', M4', . . . Mn', respectively, are current-to-voltage converters 80, 80', which convert the non-inverted output current Io and the inverted output current Io' into current values, respectively. Writing and reading operation of the memory cells M1' to Mn' is controlled by control signals φ1 to φn, φ1' to φn', and φ1" to φn" generated based upon a clock signal CLK by a control circuit 30. An output signal of the current-to-voltage converter 80 is supplied to an inverting input terminal 41b of an adder 41, and an output signal of the current-to-voltage converter 80' is supplied to a non-inverting input terminal 41a of the adder 41. The output signal of the current-to-voltage converter 80 and the output signal of the current-to-voltage converter 80' are opposite in polarity to each other, and therefore the adder 41 synthesizes the two signals while equalizing the polarities thereof, to thereby reproduce the input analog signal Vin with a predetermined delay. A low-pass filter, not shown, is provided at a later stage of the present delay circuit, for fully removing the clock component. This low-pass filter exhibits a flat frequency characteristic at a frequency band corresponding to that of the input analog signal Vin, and a sufficient attenuation characteristic at or in the vicinity of the sampling frequency.

Therefore, in this embodiment, too, similarly to the first embodiment, even if low-frequency noise passes into the memory cells M1' to Mn', the low-frequency noise can be frequency-converted to a frequency in the vicinity of the sampling frequency, which makes it possible to remove or separate the low-frequency noise, which could not be removed according to the prior art, from the output analog signal Vout, to thereby improve the signal-to-noise ratio. Further, similarly to the third embodiment, voltage can be accurately read out from the memory cells M1' to Mn' without being affected by the parasitic capacitance, and moreover, the reading-out from the same memory cell can be carried out a plurality of times As described above, according to the fifth embodiment, two advantages of removal of low-frequency noise as achieved by the first embodiment and elimination of adverse effect of the parasitic capacitance as achieved by the third embodiment can be provided, thereby enabling generation of a higher-quality output analog signal.

The present invention is not limited to the above described embodiments, and it is understood that variations and modifications can be effected without departing from the spirit and scope of the invention as set forth in the appended claims. For example:

(i) The delay circuits according to the above described embodiments can be utilized as an echo device or reverberation device of a karaoke apparatus. In this case, the output analog signal Vout of the delay circuit is multiplied by a coefficient, the resulting sum and the input analog signal are added together, and the resulting sum is input to the delay circuit. Further, the delay circuit may be applied for processing a video signal, in addition to an audio signal.

(ii) The operations of writing the input analog signal into the memory cells as employed in the above described embodiments are equivalent to sampling operations. Accordingly, if the frequency band of the input analog signal Vin is wide, aliasing noise can occur. To prevent occurrence of aliasing noise, a low-pass filter having a cutoff frequency corresponding to the sampling frequency may be provided at the input side of the delay circuit. This low-pass filter may be implemented by suitably setting the frequency characteristics of the voltage-to-current converters 70, 70' employed in the third and fifth embodiments.

(iii) In the first, third, and fifth embodiments, the operation of reading out from each memory cell may be carried out in a time-sharing manner within each sampling period so as to generate a plurality of delayed signals per sampling period. The generated delayed signals are different in delay time from each other and therefore equivalent to a tap output of a transversal filter. Therefore, a transversal filter can be realized by adding together the delayed signals in a suitable ratio.

(iv) Although in the fourth and fifth embodiments the output analog signal Vout is synthesized by the adder 41, it may be synthesized by a sample-and-hold circuit.

(v) Although in the first, second, and fourth embodiments the capacitors C1 to Cn are grounded at ends thereof, they may be connected at ends thereof to a power supply. In short, it suffices that they are connected at ends thereof to a constant voltage line.

Figure 13:
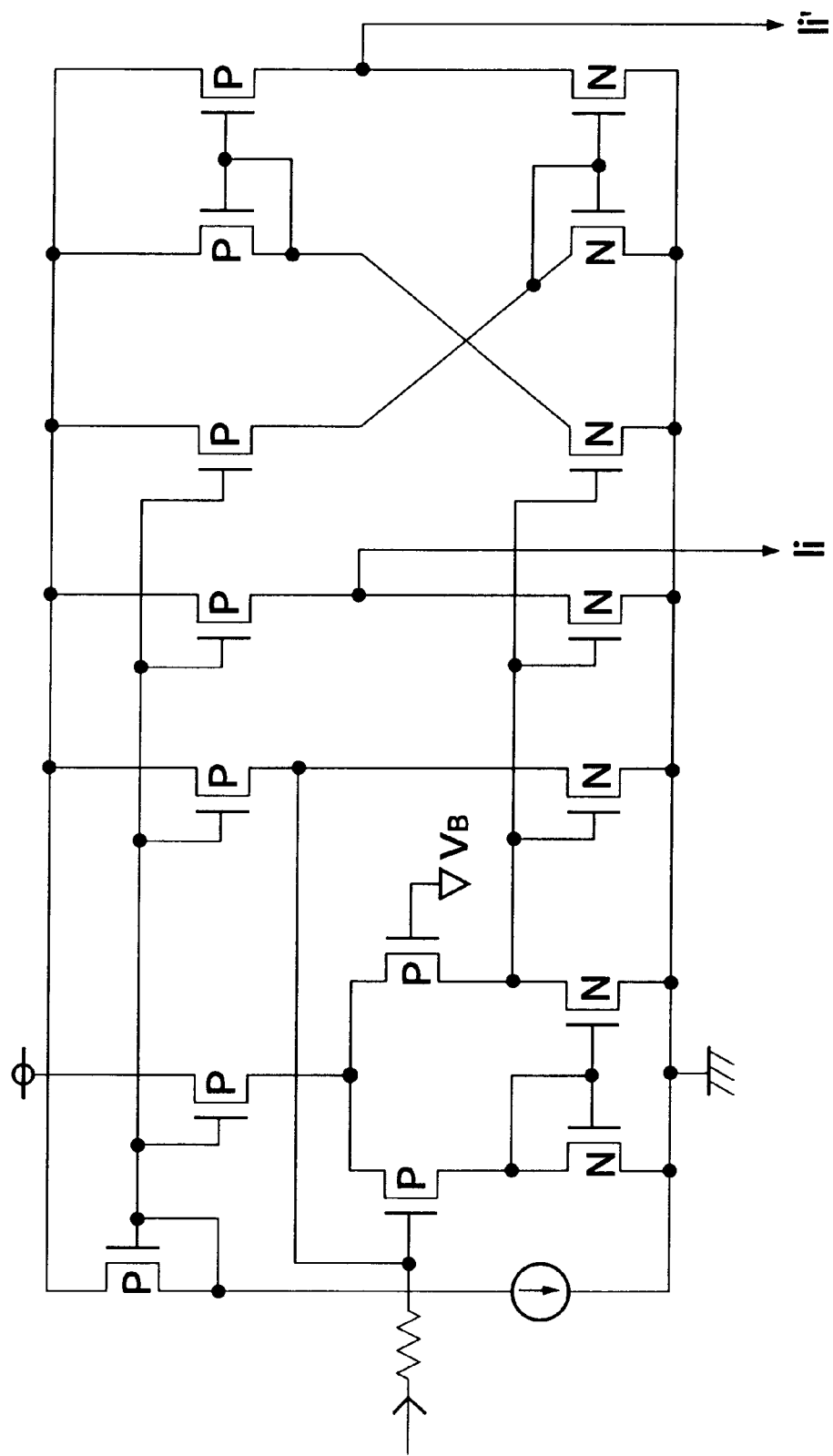
FIG. 13 is a circuit diagram showing the construction of a normal or non-inverted current-to-voltage converter and an inverted current-to-voltage converter according to a variation of the fifth embodiment.

(vi) Although in the third and fifth embodiments the memory cells M1' to Mn' are composed of capacitors C1 to Cn and N-channel FETs N1 to Nn which are grounded at ends thereof, the invention is not limited to this, but alternatively the capacitors C1 to Cn may be connected at ends thereof to a power supply, and P-channel FETs may be used instead of N-channel FETs. Further, in the fifth embodiment, the non-inverted voltage-to-current converter 70 and the inverted voltage-to-current converter 70' may be formed as a single integral circuit, as shown in FIG. 13, for example.

What is claimed is:

1. A delay circuit comprising:
   a plurality of memory cells including a plurality of capacitors, that store an analog signal as an input signal by storing charge of said input signal in said capacitors;
   a first inverting device that inverts said input signal to generate an inverted signal;
   a writing device that selects said input signal and said inverted signal alternately and sequentially writes the selected signals into said memory cells in a predetermined writing sequence;
   a reading device that sequentially reads out said input signal and said inverted signal from said memory cells in a sequence corresponding to said predetermined writing sequence;
   a second inverting device that inverts said inverted signal read out by said reading device; and
   a synthesizing device that synthesizes an output signal from said input signal read out by said reading device and an output signal of said second inverting device.

2. A delay circuit as claimed in claim 1, wherein said memory cells each comprise an input terminal, a first switch having one end thereof connected to said input terminal, a corresponding one of said capacitors connected between another end of said first switch and ground, an output terminal, and a second switch connected between said another end of said first switch and said output terminal.

3. A delay circuit comprising:
a plurality of memory cells including a plurality of capacitors, that store an analog signal as an input signal by storing charge of said input signal in said capacitors, said memory cells each having an output;
a writing device that sequentially writes said input signal into said memory cells in a predetermined writing sequence;
a negative feedback amplifier including a non-inverting input terminal disposed to receive constant voltage, an inverting input terminal connected to said output of each of said memory cells, an output terminal, and a feedback capacitor connected between said inverting input terminal and said output terminal;
a reading device that performs reading operation of sequentially reading out said input signal from said memory cells in a sequence corresponding to said predetermined writing sequence, by causing charge stored in said capacitors of said memory cells to be moved into said feedback capacitor; and
a resetting device that clears charge stored in said feedback capacitor before the reading operation of said reading device.

4. A delay circuit as claimed in claim 3, including a sample-and-hold device that samples and holds an output of said negative feedback amplifier in synchronism with the reading operation of said reading device.

5. A delay circuit as claimed in claim 3, wherein said memory cells each comprise an input terminal, a first switch having one end thereof connected to said input terminal, a corresponding one of said capacitors connected between another end of said first switch and ground, an output terminal, and a second switch connected between said another end of said first switch and said output terminal.

6. A delay circuit as claimed in claim 4, wherein said memory cells each comprise an input terminal, a first switch having one end thereof connected to said input terminal, a corresponding one of said capacitors connected between another end of said first switch and ground, an output terminal, and a second switch connected between said another end of said first switch and said output terminal.

7. A delay circuit comprising:
a plurality of memory cells including a plurality of capacitors, that store an input analog signal by storing charge of said input signal in said capacitors;
a voltage-to-current converter that converts a voltage signal as said input analog signal into current to thereby generate an input current signal;
a writing device that sequentially writes said input current signal into said memory cells in a predetermined writing sequence;
a reading device that sequentially reads out said input current signal from said memory cells in a sequence corresponding to said predetermined writing sequence; and
a current-to-voltage converter that converts said input current signal read out by said reading device into voltage to thereby generate an output voltage signal.

8. A delay circuit as claimed in claim 7, wherein said memory cells each comprise an input terminal, a first switch having one end thereof connected to said input terminal, an output terminal, a second switch connected between another end of said first switch and said output terminal, a corresponding one of said capacitors, a third switch connected between said another end of said first switch and one end of said corresponding one of said capacitors, and a field effect transistor having a gate thereof connected to said one end of said corresponding one of said capacitors, and a source and a drain thereof connected between another end of said corresponding one of said capacitors and said another end of said first switch.

9. A delay circuit comprising:
a plurality of memory cells including a plurality of capacitors, that store an analog signal as an input signal by storing charge of said input signal in said capacitors, said memory cells each having an output;
an inverting device that inverts said input signal to generate an inverted signal;
a writing device that selects said input signal and said inverted signal alternately and sequentially writes the selected signals into said memory cells in a predetermined writing sequence;
a reading device that sequentially reads out said input signal and said inverted signal from said memory cells in a sequence corresponding to said predetermined writing sequence;
a first negative feedback amplifier including a non-inverting input terminal disposed to receive constant voltage, an inverting input terminal connected to said output of each of at least one of said memory cells into which said input signal is written, an output terminal, and a first feedback capacitor connected between said inverting input terminal and said output terminal;
a second negative feedback amplifier including a non-inverting input terminal disposed to receive constant voltage, an inverting input terminal connected to said output of each of at least one of said memory cells into which said inverted signal is written, an output terminal, and a second feedback capacitor connected between said inverting input terminal and said output terminal;
a reading device that performs reading operation of sequentially reading out said input signal and said inverted signal from said memory cells in a sequence corresponding to said predetermined writing sequence, by causing charge stored in said capacitors of said memory cells to be moved into said first and second feedback capacitors;
a first resetting device that clears charge stored in said first feedback capacitor before the reading operation of reading out said input signal of said reading device;
a second resetting device that clears charge stored in said second feedback capacitor before the reading operation of reading out said inverted signal of said reading device; and
a synthesizing device that inverts an output signal of said second negative feedback amplifier and synthesizes an output signal from the inverted output signal and an output signal of said first negative feedback amplifier.

10. A delay circuit as claimed in claim 9, wherein said memory cells each comprise an input terminal, a first switch having one end thereof connected to said input terminal, a corresponding one of said capacitors connected between another end of said first switch and ground, an output terminal, and a second switch connected between said another end of said first switch and said output terminal.

11. A delay circuit comprising:
- a plurality of memory cells including a plurality of capacitors, that store an input analog signal by storing charge of said input analog signal in said capacitors;
- a first voltage-to-current converter that converts a voltage signal as said input analog signal into current to thereby generate an input current signal;
- an inverting device that inverts said voltage signal to thereby generate an inverted voltage signal;
- a second voltage-to-current converter that converts said inverted voltage signal into current to thereby generate an inverted input current signal;
- a writing device that selects said input current signal and said inverted input current signal alternately and sequentially writes the selected signals into said memory cells in a predetermined writing sequence;
- a reading device that sequentially reads out said input current signal and said inverted input current signal from said memory cells in a sequence corresponding to said predetermined writing sequence; and
- an output voltage signal generating device that generates an output voltage signal based upon said input current signal and said inverted input current signal read out by said reading device.

12. A delay circuit as claimed in claim 11, wherein said memory cells each comprise an input terminal, a first switch having one end thereof connected to said input terminal, an output terminal, a second switch connected between another end of said first switch and said output terminal, a corresponding one of said capacitors, a third switch connected between said another end of said first switch and one end of said corresponding one of said capacitors, and a field effect transistor having a gate thereof connected to said one end of said corresponding one of said capacitors, and a source and a drain thereof connected between another end of said corresponding one of said capacitors and said another end of said first switch.

13. A delay circuit as claimed in claim 11, wherein said output voltage signal generating device comprises:
- a first current-to-voltage converter that subjects said input current signal read out by said reading device to current-to-voltage conversion;
- a second current-to-voltage converter that subjects said inverted input current signal read out by said reading device to current-to-voltage conversion; and
- a synthesizing device that synthesizes said output voltage signal from an output signal of said first current-to-voltage converter and an output signal of said second current-to-voltage converter.

14. A delay circuit as claimed in claim 13, wherein said memory cells each comprise an input terminal, a first switch having one end thereof connected to said input terminal, an output terminal, a second switch connected between another end of said first switch and said output terminal, a corresponding one of said capacitors, a third switch connected between said another end of said first switch and one end of said corresponding one of said capacitors, and a field effect transistor having a gate thereof connected to said one end of said corresponding one of said capacitors, and a source and a drain thereof connected between another end of said corresponding one of said capacitors and said another end of said first switch.

* * * * *